(12) United States Patent
Zanbaghi et al.

(10) Patent No.: US 10,014,879 B1
(45) Date of Patent: Jul. 3, 2018

(54) CAPACITANCE-TO-DIGITAL CONVERTER

(71) Applicant: Cirrus Logic International Semiconductor Ltd., Edinburgh (GB)

(72) Inventors: Ramin Zanbaghi, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/827,530

(22) Filed: Nov. 30, 2017

(51) Int. Cl.
| | |
|---|---|
| *H03M 1/10* | (2006.01) |
| *H03M 3/00* | (2006.01) |
| *G01R 27/26* | (2006.01) |
| *H03M 1/12* | (2006.01) |
| *G01R 19/25* | (2006.01) |

(52) U.S. Cl.
CPC ............ *H03M 3/458* (2013.01); *G01R 19/25* (2013.01); *G01R 27/2605* (2013.01); *H03M 1/12* (2013.01); *H03M 3/362* (2013.01); *H03M 3/384* (2013.01); *H03M 3/43* (2013.01); *H03M 3/438* (2013.01)

(58) Field of Classification Search
CPC ...... H03M 3/458; H03M 3/384; H03M 3/438; H03M 3/362; H03M 1/12; H03M 3/00; H03M 3/43; G01R 19/25; G01R 27/2605; G01R 27/26
USPC ................................. 341/143, 121, 131, 200
See application file for complete search history.

(56) References Cited

U.S. PATENT DOCUMENTS

| | | | | |
|---|---|---|---|---|
| 7,508,330 | B1 * | 3/2009 | Chandra ............. | H03M 1/0663 341/143 |
| 8,547,114 | B2 * | 10/2013 | Kremin ................... | G06F 3/044 324/678 |
| 2008/0111714 | A1 * | 5/2008 | Kremin ................... | G06F 3/044 341/33 |
| 2008/0303703 | A1 * | 12/2008 | Josefsson ................ | H03M 3/47 341/143 |
| 2013/0099955 | A1 * | 4/2013 | Shaeffer .............. | H03M 7/3015 341/200 |
| 2013/0207820 | A1 * | 8/2013 | Maurino ............... | H03M 3/328 341/131 |
| 2014/0062748 | A1 * | 3/2014 | Kinyua ................. | H03M 3/504 341/150 |
| 2014/0240155 | A1 * | 8/2014 | Quiquempoix ....... | H03M 3/322 341/143 |

\* cited by examiner

*Primary Examiner* — Jean B Jeanglaude
(74) *Attorney, Agent, or Firm* — Jackson Walker L.L.P.

(57) ABSTRACT

A method for measuring capacitance may include integrating charge with a charge integrator having a charge integrator input and output, filtering, with a loop filter having a loop filter input coupled to the charge integrator output and having a loop filter output, a first signal generated at the charge integrator output, quantizing, with quantizer having a quantizer input coupled to the loop filter output and a having quantizer output, a second signal generated at the loop filter output, processing, with a first feedback path having a first feedback path input coupled to the quantizer output and a first feedback path output coupled to the charge integrator input, a low-frequency spectrum of a quantizer output signal, and processing, with a second feedback path having a second feedback path input coupled to the quantizer output and a second feedback path output coupled downstream in a signal path of the apparatus relative to the charge integrator, a high-frequency spectrum of the quantizer output signal.

14 Claims, 2 Drawing Sheets

US 10,014,879 B1

CAPACITANCE-TO-DIGITAL CONVERTER

FIELD OF DISCLOSURE

The present disclosure relates in general to measuring capacitance, and more specifically, to systems and methods for measuring capacitance using a capacitance to digital converter.

BACKGROUND

In many electrical and electronic systems, it may be desirable to measure a capacitance within a circuit in order to take action responsive to the measured capacitance. One type of apparatus for measuring capacitance is known as a capacitance-to-digital converter, or "CDC," which is capable of measuring a capacitance and generating a digital output signal indicative of a magnitude of the measured capacitance.

Many traditional and existing CDCs possess significant drawbacks and disadvantages. For example, existing CDCs are often implemented using an open-loop capacitance-to-voltage converter (CVC) followed by an anti-aliasing filter and a discrete-time analog-to-digital converter (ADC). One disadvantage associated with the use of an open-loop CVC is that open-loop CVCs often suffer from signal distortion. In addition, one disadvantage in using a discrete-time ADC is that it requires the use of the anti-aliasing filter, which requires physical area within a circuit and consumes significant power during operation.

SUMMARY

In accordance with the teachings of the present disclosure, certain disadvantages and problems associated with performance of existing capacitance-to-digital converters have been reduced or eliminated.

In accordance with embodiments of the present disclosure, an apparatus for measuring capacitance may include a charge integrator, a first feedback path, a second feedback path, a loop filter, and a quantizer. The charge integrator may include a charge integrator input and a charge integrator output. The first feedback path may have a first feedback path input and a first feedback path output, wherein the first feedback path output is coupled to an input of the charge integrator. The second feedback path may have a second feedback path input and a second feedback path output, wherein the second feedback path output is coupled downstream in a signal path of the apparatus relative to the charge integrator. The loop filter may have a loop filter input and a loop filter output, wherein the loop filter input is coupled to the output of the charge integrator and second feedback path output. A quantizer may have a quantizer input and a quantizer output, wherein the quantizer input is coupled to the loop filter output, the quantizer output is coupled to the first feedback path and the quantizer is configured to quantize a signal generated at the loop filter output. The first feedback path may process a low-frequency spectrum of a quantizer output signal at the quantizer output so that high-frequency quantization noise is filtered from passing through the charge integrator. The second path may process a high-frequency spectrum of the quantizer output signal.

In accordance with these and other embodiments of the present disclosure, a method for measuring capacitance may include integrating charge with a charge integrator having a charge integrator input and a charge integrator output; filtering, with a loop filter having a loop filter input coupled to the charge integrator output and having a loop filter output, a first signal generated at the charge integrator output; quantizing, with a quantizer having a quantizer input coupled to the loop filter output and a having quantizer output, a second signal generated at the loop filter output; processing, with a first feedback path having a first feedback path input coupled to the quantizer output and a first feedback path output coupled to the charge integrator input, a low-frequency spectrum of a quantizer output signal at the quantizer output so that high-frequency quantization noise is filtered from passing through the charge integrator; and processing, with a second feedback path having a second feedback path input coupled to the quantizer output and a second feedback path output coupled downstream in a signal path of the apparatus relative to the charge integrator, a high-frequency spectrum of the quantizer output signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
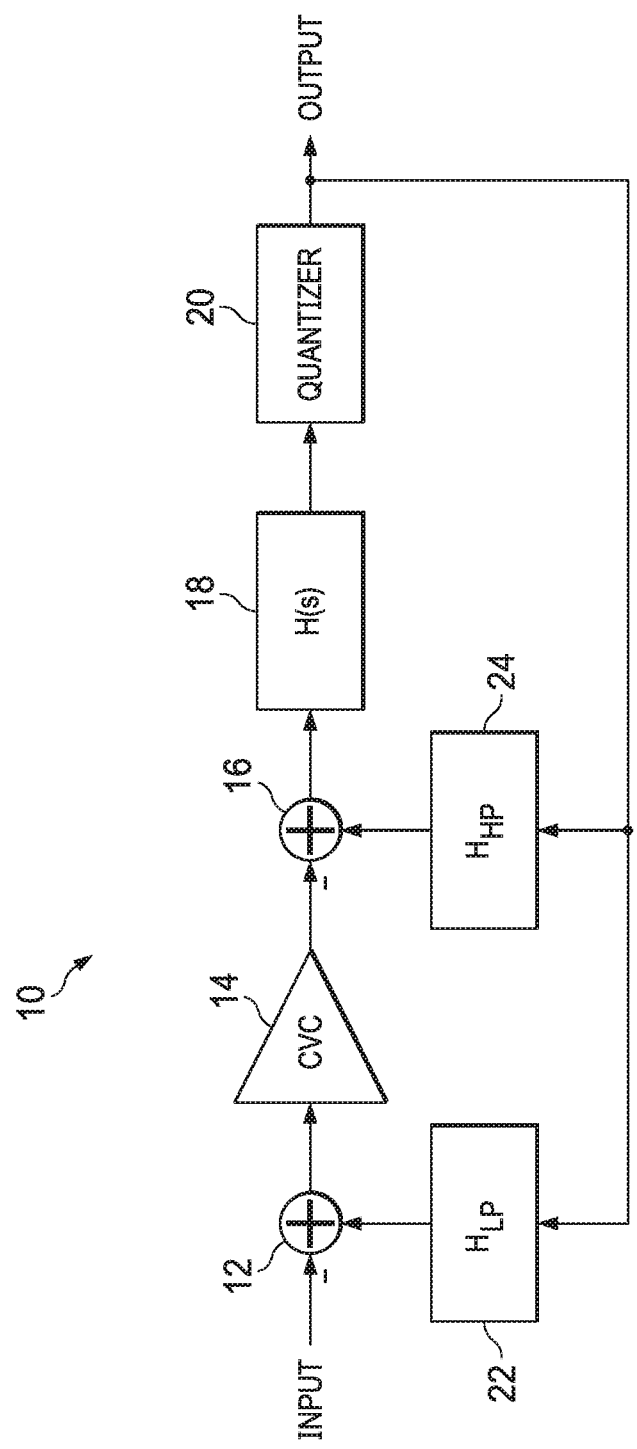
FIG. 1 is a block diagram of selected components of an example capacitance-to-digital converter, in accordance with embodiments of the present disclosure.

FIG. 1 is a block diagram of selected components of an example capacitance-to-digital converter (CDC) 10, in accordance with embodiments of the present disclosure. As shown in FIG. 1, CDC 10 may include a combiner 12, a capacitance-to-voltage converter (CVC) 14, a combiner 16, a loop filter 18, a quantizer 20, a low-pass filter 22, and a high-pass filter 24 arranged as shown in FIG. 1.

CVC 14 may comprise a charge integrator having a charge integrator input and a charge integrator output and may be configured to integrate charge at its input to generate a voltage signal indicative of a capacitance coupled to an input of CDC 10 labeled as "INPUT" in FIG. 1.

Loop filter 18 may include a loop filter input and a loop filter output and may be configured to apply a filter response H(s) to a signal received at the loop filter input to generate a filtered signal at the loop filter output. Quantizer 20 may include a quantizer input coupled to the loop filter output and may also include a quantizer output, and may be configured to quantize a signal received at the quantizer input to generate a quantizer output signal at the quantizer output. Such quantizer output signal may comprise an output signal of CDC 10 that is generated at an output of CDC 10 labeled as "OUTPUT" in FIG. 1. In some embodiments, loop filter 18 may comprise a delta-sigma modulator. In these and other embodiments, loop filter 18 may comprise a discrete-time loop filter such that together, loop filter 18 and quantizer 20 may form a continuous time analog-to-digital converter (ADC) that converts an analog signal received at the loop filter input to an equivalent digital signal as the quantizer output signal, such that the quantizer output signal is a digital signal indicative of a capacitance coupled to an input of CDC 10 labeled as "INPUT" in FIG. 1.

Also, as shown in FIG. 1, CDC 10 may include a first feedback path having a first feedback path input coupled to the quantizer output and a first feedback path output coupled to the charge integrator input of CVC 14. Such first feedback path may include low-pass filter 22 having a response $H_{LP}$. Combiner 12 may subtract the feedback signal generated by the first feedback path from an input signal received at the input of CDC 10.

Further, as shown in FIG. 1, CDC 10 may include a second feedback path having a second feedback path input coupled to the quantizer output and a second feedback path output coupled to the loop filter input of loop filter 18, such that the second feedback path output is coupled downstream in the signal path of CDC 10 relative to the charge integrator of CVC 14. Such second feedback path may include high-pass filter 24 having a response $H_{HP}$. Combiner 16 may subtract the feedback signal generated by the second feedback path from the signal generated by CVC 14.

The response $H_{LP}$ of low-pass filter 22 and the response $H_{HP}$ of high-pass filter 24 may be such that if combined, the combined response of low-pass filter 22 and high-pass filter 24 would comprise an all-pass filter. Accordingly, in operation, the first feedback path may process a low-frequency spectrum of the quantizer output signal so that high-frequency quantization noise is filtered from passing through the charge integrator of CVC 14, and the second feedback path may process a high-frequency spectrum of the quantizer output signal, thus preventing components of a pilot tone applied to the input of CDC 10 or direct-current signal components from passing through the ADC formed by loop filter 18 and quantizer 20.

Figure 2:
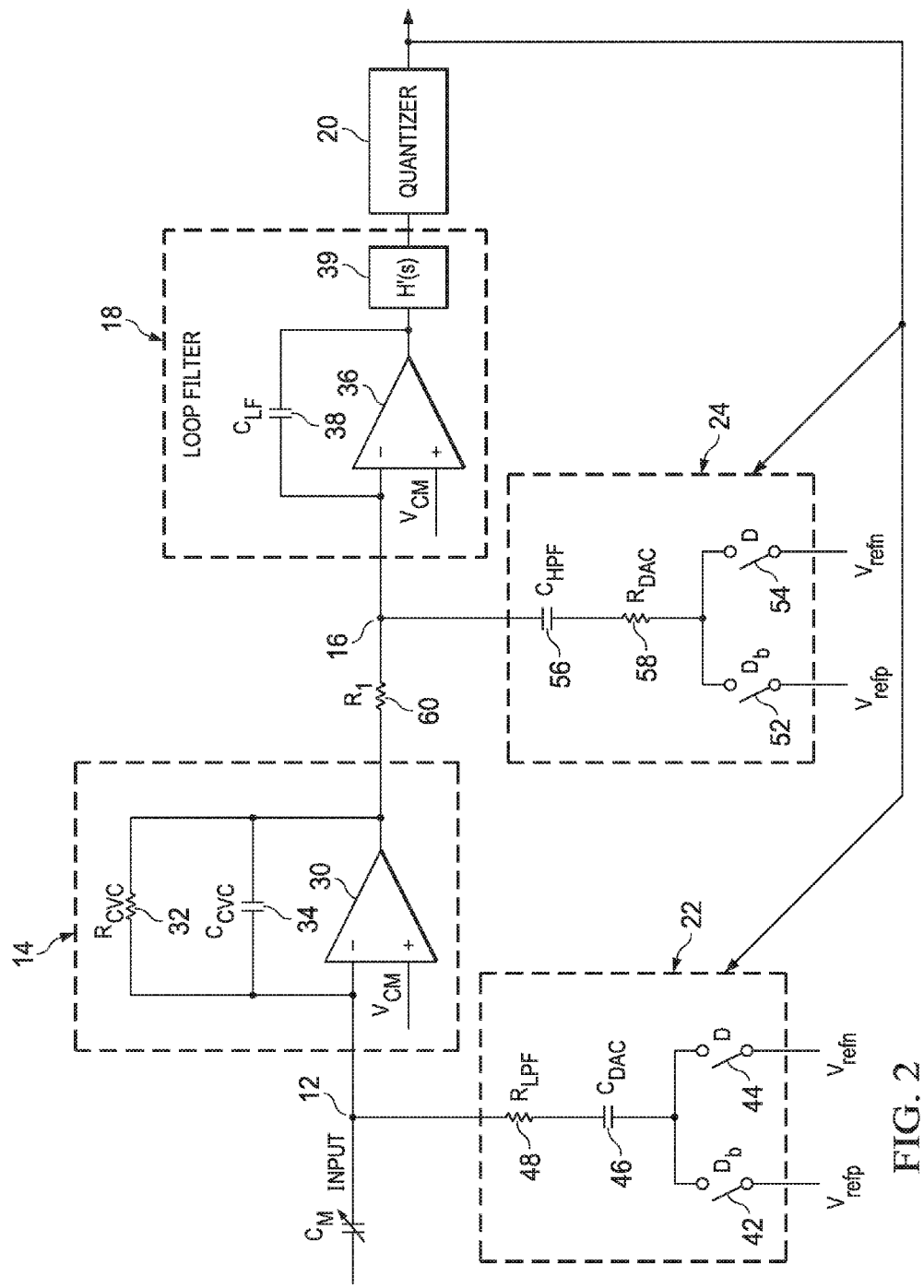
FIG. 2 is a circuit diagram showing circuit-level detail of selected components of the example capacitance-to-digital converter depicted in FIG. 1, in accordance with embodiments of the present disclosure.

FIG. 2 is a circuit diagram showing some circuit-level detail of selected components of CDC 10 depicted in FIG. 1 for measuring a variable capacitance $C_m$ coupled to the input of CDC 10, in accordance with embodiments of the present disclosure. As shown in FIG. 2, CVC 14 may be implemented with an operational amplifier 30 receiving a common-mode voltage $V_{cm}$ at its non-inverting input and coupled at its inverting input to the input of CDC 10. CVC 14 may also include a parallel combination of resistor 32 and capacitor 34 coupled between the inverting input of operational amplifier 30 and an output of operational amplifier 30.

Also as shown in FIG. 2, loop filter 18 may be implemented with an operational amplifier 36 receiving a common-mode voltage $V_{cm}$ at its non-inverting input and coupled at its inverting input to the output of operational amplifier via a resistor 60. Loop filter 18 may also include a capacitor 38 coupled between the inverting input of operational amplifier 36 and an output of operational amplifier 36. In second-order and higher-than-second-order implementations, loop filter 18 may also include a filter block 39 with response H'(s) which, combined with the response of operational amplifier 36 and capacitor 38, may form response H(s) of loop filter 18. In first-order implementations, filter block 39 may be absent or H'(s) may be equal to 1.

Further as shown in FIG. 2, low-pass filter 22 may be implemented by a capacitive digital-to-analog converter (e.g., itself implemented with switch 42, switch 44, and capacitor 46) used to convert the quantizer output signal into an equivalent analog signal in series with a resistor 48 coupled to the charge integrator input of CVC 14. Combiner 12 may effectively be implemented by an electrical node common to the first feedback path output and the charge integrator input.

As additionally shown in FIG. 2, high-pass filter may be implemented by a resistive digital-to-analog converter (e.g., itself implemented with switch 52, switch 54, and resistor 58) used to convert the quantizer output signal into an equivalent analog signal in series with a capacitor 56 coupled to the loop filter input of loop filter 18. Combiner 16 may effectively be implemented by an electrical node common to the second feedback path output and the loop filter input.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend.

Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An apparatus for measuring capacitance, comprising:
   a charge integrator having a charge integrator input and a charge integrator output;
   a first feedback path having a first feedback path input and a first feedback path output, wherein the first feedback path output is coupled to an input of the charge integrator;
   a second feedback path having a second feedback path input and a second feedback path output, wherein the second feedback path output is coupled downstream in a signal path of the apparatus relative to the charge integrator;
   a loop filter having a loop filter input and a loop filter output, wherein the loop filter input is coupled to the output of the charge integrator and second feedback path output; and
   a quantizer having a quantizer input and a quantizer output, wherein the quantizer input is coupled to the loop filter output, the quantizer output is coupled to the first feedback path and the quantizer is configured to quantize a signal generated at the loop filter output;
   wherein:

the first feedback path processes a low-frequency spectrum of a quantizer output signal at the quantizer output so that high-frequency quantization noise is filtered from passing through the charge integrator; and the second feedback path processes a high-frequency spectrum of the quantizer output signal.

2. The apparatus of claim 1, wherein the first feedback path comprises a digital-to-analog converter.

3. The apparatus of claim 2, wherein the digital-to-analog converter comprises a switched capacitor digital-to-analog converter.

4. The apparatus of claim 1, wherein the second feedback path comprises a digital-to-analog converter.

5. The apparatus of claim 4, wherein the digital-to-analog converter comprises a switched resistor digital-to-analog converter.

6. The apparatus of claim 1, wherein the loop filter comprises a discrete-time loop filter.

7. The apparatus of claim 1, wherein the loop filter comprises a delta-sigma modulator.

8. A method for measuring capacitance, comprising:

integrating charge with a charge integrator having a charge integrator input and a charge integrator output;

filtering, with a loop filter having a loop filter input coupled to the charge integrator output and having a loop filter output, a first signal generated at the charge integrator output;

quantizing, with a quantizer having a quantizer input coupled to the loop filter output and a having quantizer output, a second signal generated at the loop filter output;

processing, with a first feedback path having a first feedback path input coupled to the quantizer output and a first feedback path output coupled to the charge integrator input, a low-frequency spectrum of a quantizer output signal at the quantizer output so that high-frequency quantization noise is filtered from passing through the charge integrator; and processing, with a second feedback path having a second feedback path input coupled to the quantizer output and a second feedback path output coupled downstream in a signal path of the apparatus relative to the charge integrator, a high-frequency spectrum of the quantizer output signal.

9. The method of claim 8, wherein the first feedback path comprises a digital-to-analog converter.

10. The method of claim 9, wherein the digital-to-analog converter comprises a switched capacitor digital-to-analog converter.

11. The method of claim 8, wherein the second feedback path comprises a digital-to-analog converter.

12. The method of claim 11, wherein the digital-to-analog converter comprises a switched resistor digital-to-analog converter.

13. The method of claim 8, wherein the loop filter comprises a discrete-time loop filter.

14. The method of claim 8, wherein the loop filter comprises a delta-sigma modulator.

\* \* \* \* \*